US006821880B1

(12) United States Patent
Tao et al.

(10) Patent No.: US 6,821,880 B1
(45) Date of Patent: Nov. 23, 2004

(54) PROCESS OF DUAL OR SINGLE DAMASCENE UTILIZING SEPARATE ETCHING AND DCM APPARATI

(75) Inventors: Hun-Jan Tao, Hsinchu Hsien (TW); Chao-Cheng Chen, Tainan Hsien (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 0 days.

(21) Appl. No.: 10/725,138

(22) Filed: Dec. 1, 2003

(51) Int. Cl.[7] .......................................... H01L 21/4763
(52) U.S. Cl. ...................... 438/618; 438/622; 438/637; 438/706; 438/710; 438/716
(58) Field of Search .................. 438/618, 620, 438/622, 627, 706–7, 709–10, 712, 716, 729–30, 733; 216/79, 41, 67

(56) References Cited

U.S. PATENT DOCUMENTS 6,309,957 B1 * 10/2001 Tu et al. ..................... 438/622
6,500,357 B1 * 12/2002 Luo et al. ..................... 216/79
6,630,406 B2 * 10/2003 Waldfried et al. .......... 438/710
2003/0032278 A1   2/2003 Chen et al. ................. 438/627
2003/0057179 A1 * 3/2003 Luo et al. ..................... 216/2

* cited by examiner

Primary Examiner—Van Thu Nguyen
Assistant Examiner—Beth E. Owens
(74) Attorney, Agent, or Firm—Thomas, Kayden, Horstemeyer & Risley

(57) ABSTRACT

A process of dual damascene or damascene. The dual damascene process entails providing an etching apparatus, a DCM machine and a wafer, the wafer having a metal line, a stop layer, a dielectric layer, a contact, and a photoresist layer. The dielectric layer and the contact are etched in the etching apparatus to form a trench. The photoresist and the contact are ashed in the DCM machine. Finally the wafer is wet cleaned.

23 Claims, 5 Drawing Sheets

PROCESS OF DUAL OR SINGLE DAMASCENE UTILIZING SEPARATE ETCHING AND DCM APPARATI

BACKGROUND OF THE INVENTION

1. Field of the Invention

The present invention relates to a process of dual damascene or damascene, especially to a process with lowered cost and improved reliability.

2. Description of the Related Art

With the increase in integrity of integrated circuits, distances between the metal lines of semiconductor devices are becoming smaller. RC delay caused by the resistance between lines and the capacitance of the dielectric between the lines has become the main reason for delays in signal transmission and limits in device speed. Therefore, copper (Cu) lines and low k materials are continuously being improved for the fabrication of deep sub-micron devices to overcome the increase in parasitic resistance and capacitance caused by narrower line width in advanced process.

Dual damascene process replaces the current Al-Cu metal line process, a process of Back-End of Line (BEOL) of the wafer manufacturing, used after forming the contact plug on the silicon substrate and possibly repeated several times based on the designed number of metal line layers of the device.

Traditional dual damascene process flow can be all-in-one chamber, all-in-one system, or others. As shown in FIG. 1a, all-in-one chamber type uses an all-in-one chamber machine comprising loadlocks 111, mainframe 113, and process chamber 112. Like US 2003/0032278 "All dual damascene oxide etch process steps on one confined plasma chamber", the all-in-one chamber type accomplishes all dual damascene steps in one chamber. The all-in-one chamber using etching apparatus for ashing has a high Rc failure risk, difficulty in application to low K materials, and low reliability. As shown in FIG. 1b, an all-in-one system type uses an all-in-one system machine comprising loadlocks 121, mainframe 124, process chamber 122, and process chamber 123. When an all-in-one system type uses etching apparatus for ashing the cost of the process is high, and the process synchronization is poor.

SUMMARY OF THE INVENTION

For this reason, there is a need for a dual damascene process providing good reliability and lower cost.

To achieve this aim, the present invention provides a dual damascene process comprising via/trench etching module, dry cleaning module (DCM), and wet cleaning module. The DCM can include resist ashing, contact ashing, stop layer removal, metal line cleaning, and dielectric layer repair. In the present invention, the via/trench etching and dry cleaning modules are performed in different chambers of different machines. The present invention comprises a via forming and trench forming processes with segments thereof respectively falling into each of the 3 process modules. The via forming process comprises providing an etching apparatus, a DCM machine and a wafer, the wafer having a metal line, a stop layer, a dielectric layer, and a photoresist layer, etching the dielectric layer in the etching apparatus to form a via hole, ashing the photoresist in the DCM machine, and wet cleaning the wafer. The trench forming process comprises providing an etching apparatus, a DCM machine, and a wafer, the wafer having a metal line, a stop layer, a dielectric layer, a contact, and a photoresist layer, etching the dielectric layer and the contact in the etching apparatus to form a trench, ashing the photoresist and the contact in the DCM machine, and wet cleaning the wafer.

The present invention has the advantages of good production capability, lower costs and defects, and extendibility to many low K materials.

DETAILED DESCRIPTION OF THE INVENTION

Figure 1A:
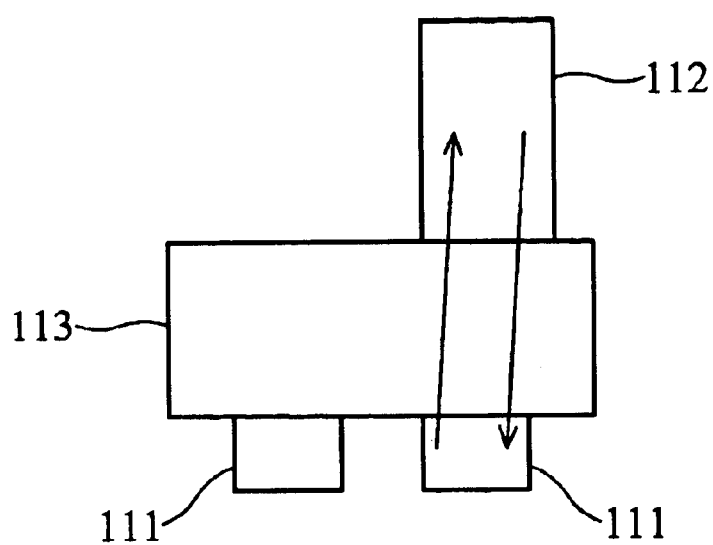
FIG. 1a shows a conventional all-in-one chamber machine.
Figure 1B:
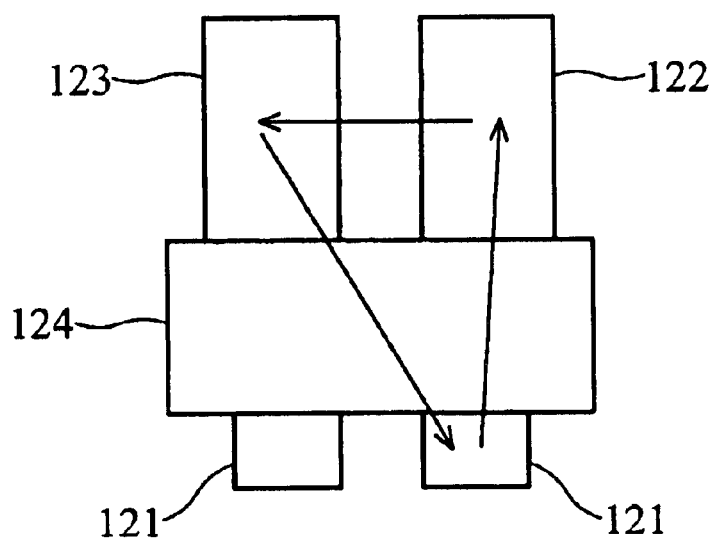
FIG. 1b shows a conventional all-in-one system machine.
Figure 2:
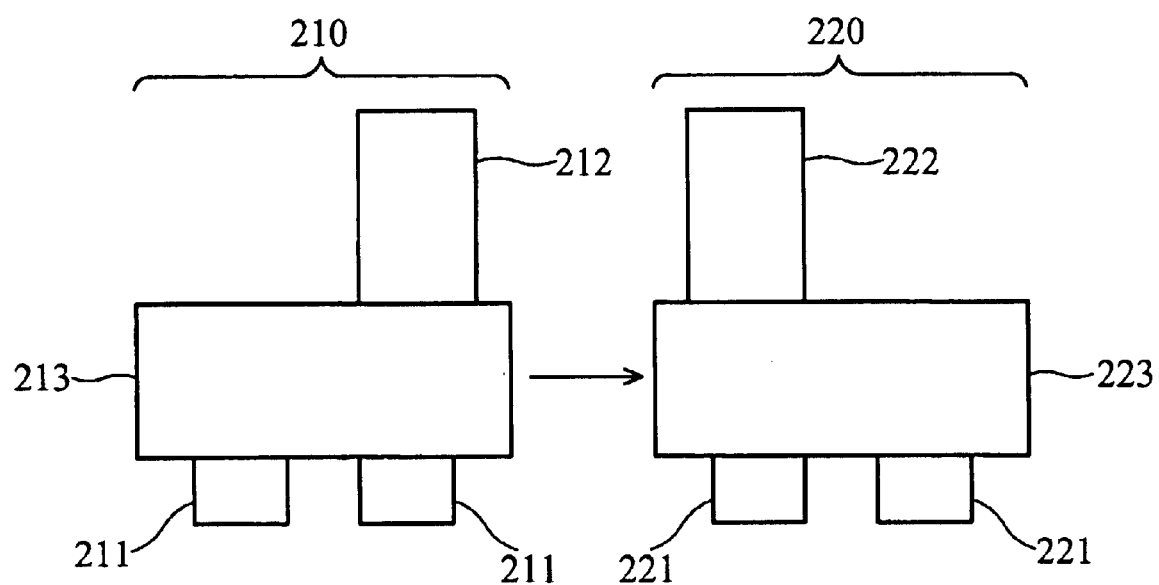
FIG. 2 shows an etching apparatus and a DCM machine of the present invention.

In terms of a process flow, the present invention comprises via/trench etching module, dry cleaning module (DCM), and wet cleaning module. As shown in FIG. 2, the via/trench etching and dry cleaning modules of the present invention are performed in different chambers of different machines. The etching apparatus 210 comprises loadlocks 211, mainframe 213 and process chamber 212. After etching, a wafer is moved to a DCM machine. The DCM machine 220 comprises loadlocks 221, mainframe 223 and process chamber 222. The method of the present invention improves the synchronization problem present in conventional all-in-one systems.

Figure 3A:
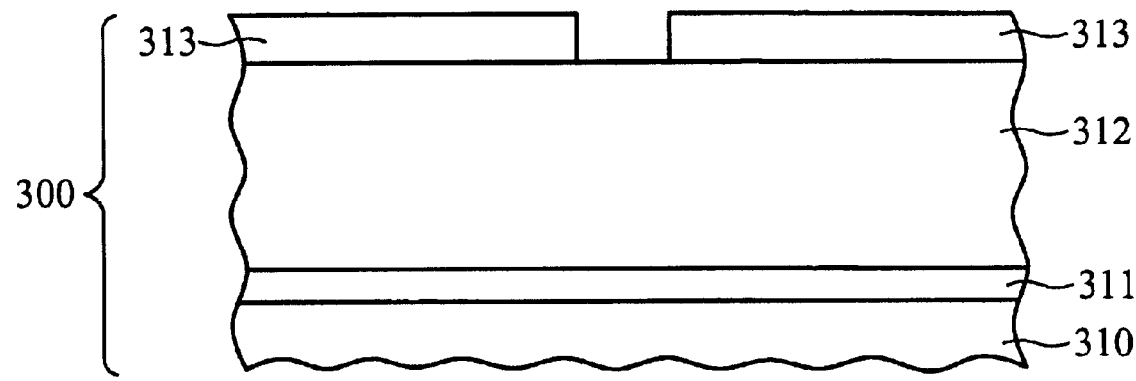
FIGS. 3a to 3f are sectional views showing a dual damascene process according to the present invention.
Figure 3B:
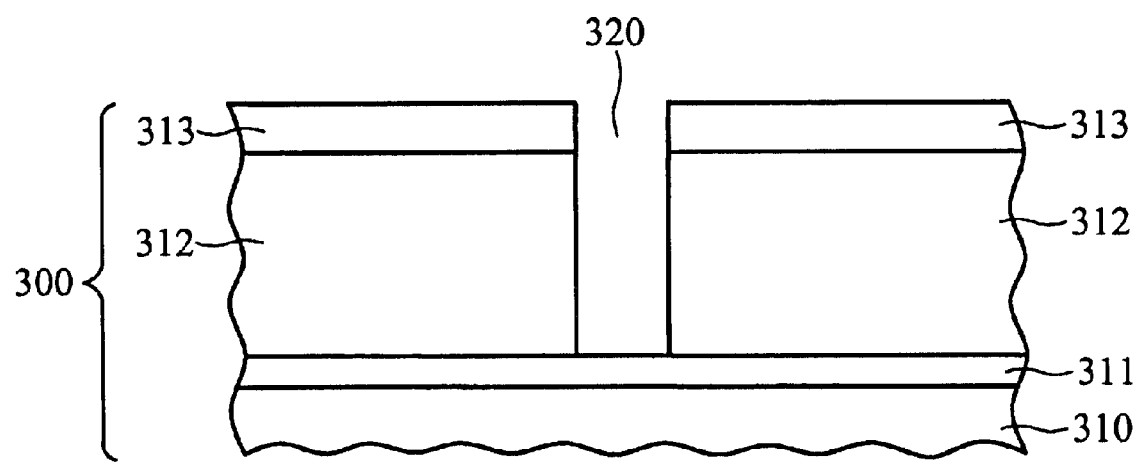
Figure 3C:
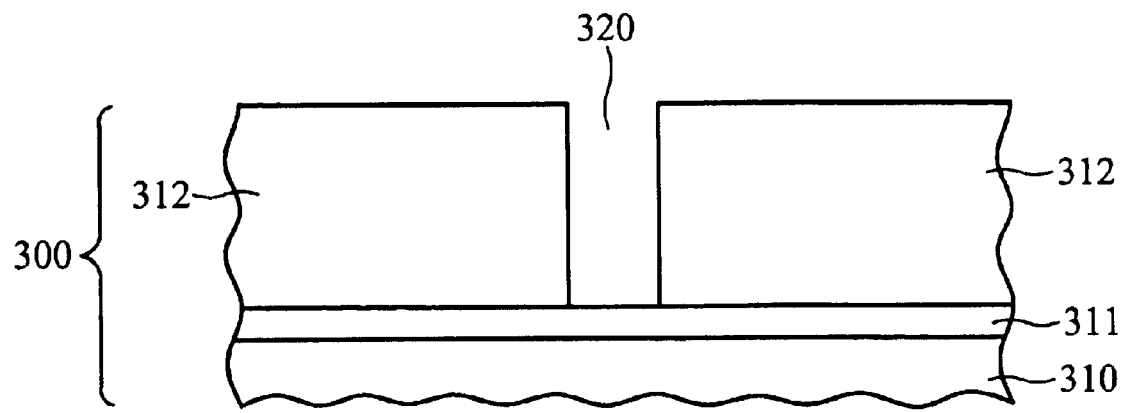

The present invention comprises a via forming and trench forming processes with segments thereof respectively falling into each of the 3 process modules. FIGS. 3a–3c illustrate the via forming process. In FIG. 3a, a wafer 300 having a metal line 310, a stop layer 311, a dielectric layer 312, and a photoresist layer 313 for defining a via pattern is provided. The wafer is placed in a process chamber of an etching apparatus. As shown in FIG. 3b, in the process chamber of the etching apparatus, the dielectric layer 312 of the wafer 300 is etched to form a via hole 320. After etching, the wafer 300 is moved to a DCM machine. As shown in FIG. 3c, in a process chamber of the DCM machine, the photoresist 313 is stripped by ashing. After processing in the DCM machine, the wafer 300 is moved to a wet cleaning machine to be cleaned. The wet cleaning step can use DHF or DI water as a cleaning solvent.

The metal line can be made of copper.

The dielectric layer can comprise low k materials.

In the ashing step, a reaction gas contained in the processing chamber comprises $O_2$, $H_2O$, $H_2$, $NH_3$ with or without $N_2$, He, or Ar. The processing chamber of the DCM machine ashes with an inductively coupled plasma generated by a dual-power (source power plus bias power) tool.

After the via forming process, the wafer is sent to plug a contact and undergoes a trench lithography process.

Figure 3D:
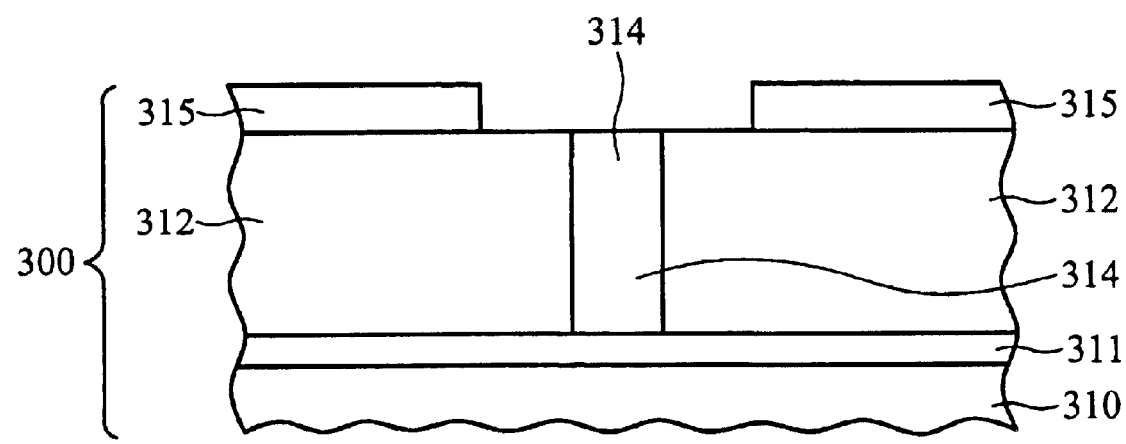
Figure 3E:
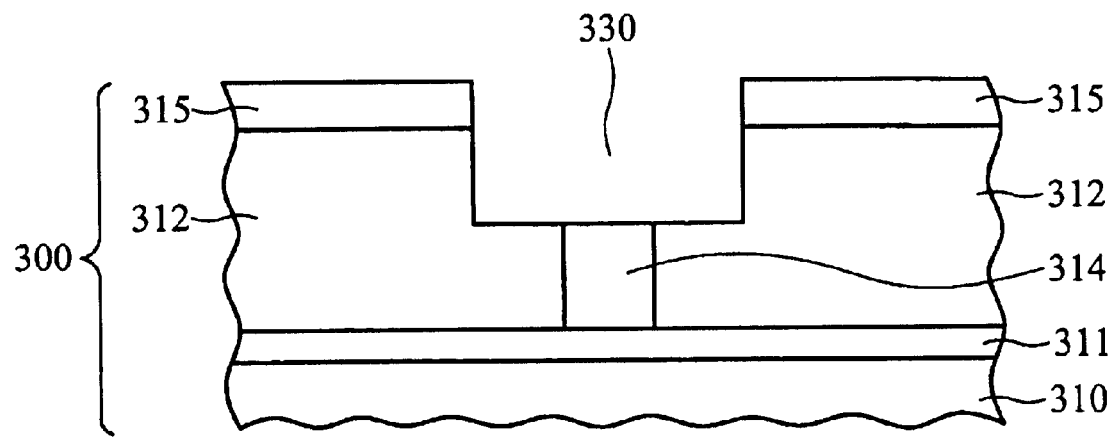
Figure 3F:
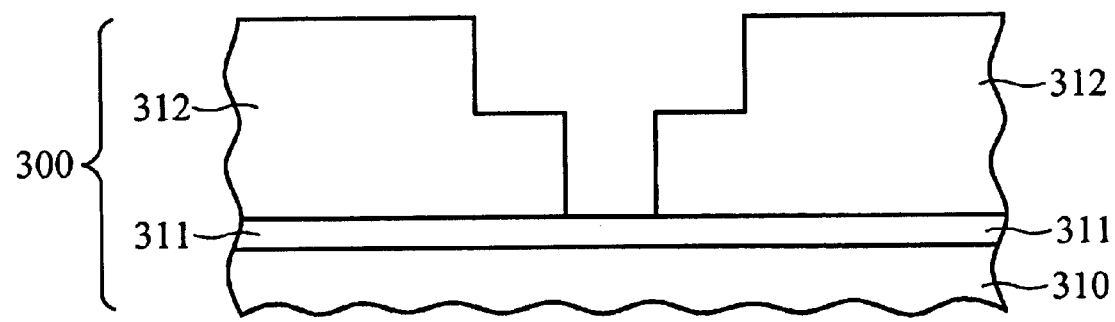

After the trench lithography process, the wafer is moved to the etching apparatus for trench forming. FIGS. 3d–3f illustrate the trench forming process. In FIG. 3d, a wafer 300 having a metal line 310, a stop layer 311, a dielectric layer 312, a contact 314, and a photoresist layer 315 is provided. The wafer is placed in the process chamber of the etching apparatus. As shown in FIG. 3e, in the process chamber of the etching apparatus, the dielectric layer 312 and the contact 314 of the wafer 300 are etched to form a trench 330. After etching, the wafer 300 is moved to a DCM machine. As shown in FIG. 3f, in the process chamber of the DCM machine, the photoresist 315 and the contact 314 is stripped by ashing, and the stop layer 311 is also removed by ashing. As well, in the process chamber of the DCM machine, the metal line 310 can be cleaned and the dielectric layer 312 can be repaired by CVD (Chemical Vapor Deposition). After processing in the DCM machine, the wafer 300 is moved to the wet cleaning machine to be cleaned. The wet cleaning step can use DHF or DI water as a cleaning solvent.

As mentioned above, in the ashing step, a reaction gas contained in the processing chamber comprises $O_2$, $H_2O$, $H_2$, $NH_3$ with or without $N_2$, He, or Ar.

The stop layer removing step can use $C_xF_y$, $C_xF_yH_2$, $SF_6$ or $NF_3$ as removal chemistry, with or without inert gas.

In the metal line cleaning step, the dry cleaning chemistry can be $O_2$ or $H_2$, with or without inert gas. The reaction temperature of the metal line cleaning step is between $-10°$ C. to $300°$ C.

In the dielectric layer repair step, the repair chemistry can be $H_2$ or halogen-silane.

The present invention improves the synchronization problems prevalent in conventional all-in-one systems. By replacing etching apparatus with specially designed DCM machine as a means of ashing, the present invention provides better electrical results and decreases the cost. Because etching and ashing are performed in different chambers, the particle condition in the process chamber is also improved, as is reliability of the product. As well, the present invention can be applied to dual damascene structures having any kind of low k material therein.

As well, the process of the present invention can be also applied in damascene process to achieve the advantages mentioned above.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A process of dual damascene or damascene, comprising the steps of:
   providing an etching apparatus, a DCM (dry cleaning module) machine and a wafer, the wafer having a metal line, a stop layer, a dielectric layer, and a photoresist;
   etching the dielectric layer in the etching apparatus to form a via hole in the dielectric layer;
   ashing the photoresist in the DCM machine with an inductively coupled plasma; and
   wet cleaning the wafer.

2. The process of claim 1, wherein the metal line comprises copper.

3. The process of claim 1, wherein the dielectric layer comprises low k material or fluorine-containing oxide.

4. The process of claim 1, wherein the ashing step uses a reaction gas comprising $O_2$, $H_2O$, $H_2$, $NH_3$, $N_2$, He, or Ar.

5. The process of claim 1, wherein the inductively coupled plasma is generated by a dual-power tool which is disposed in the DCM machine.

6. The process of claim 1, wherein the wet cleaning step uses DHF or DI water as a cleaning solvent.

7. The process of claim 1, further comprising a step of repairing the dielectric layer in the DCM machine.

8. The process of claim 1, further comprising a step of removing the stop layer in the DCM machine.

9. The process of claim 1, further comprising a step of cleaning the metal line in the DCM machine.

10. A process of dual damascene or damascene, comprising the steps of:
    providing an etching apparatus, a DCM machine and a wafer, the wafer having a metal line, a stop layer, a dielectric layer, a contact, and a photoresist layer;
    etching the dielectric layer and the contact in the etching apparatus to form a trench;
    ashing the photoresist and the contact with an inductively coupled plasma in the DCM machine; and
    wet cleaning the wafer.

11. The process of claim 10, further comprising a step of removing the stop layer in the DCM machine.

12. The process of claim 11, wherein the removing step uses a reaction gas comprising $C_xF_y$, $C_xF_yH_2$, $SF_6$ or $NF_3$.

13. The process of claim 10, further comprising a step of cleaning the metal line in the DCM machine.

14. The process of claim 13, wherein the cleaning step uses a cleaning chemistry comprising $O_2$ or $H_2$.

15. The process of claim 13, wherein the cleaning step is performed at $-10°$ C. to $300°$ C.

16. The process of claim 10, further comprising a step of repairing the dielectric layer in the DCM machine.

17. The process of claim 16, wherein the repair step uses $H_2$ as a repair chemistry.

18. The process of claim 16, wherein the repair step uses halogen-silane as a repair chemistry.

19. The process of claim 10, wherein the metal line comprises copper.

20. The process of claim 10, wherein the dielectric layer comprises low k material or fluorine-containing oxide.

21. The process of claim 10, wherein the ashing step uses a reaction gas comprising $O_2$, $H_2O$, $H_2$, $NH_3$, $N_2$, He, or Ar.

22. The process of claim 10, wherein the inductively coupled plasma is generated by a dual-power tool which is disposed in the DCM machine.

23. The process of claim 10, wherein the wet cleaning step uses DHF or DI water as a cleaning solvent.

* * * * *